United States Patent [19]

Tsurumaru

[11] Patent Number: 4,733,289
[45] Date of Patent: Mar. 22, 1988

[54] RESIN-MOLDED SEMICONDUCTOR DEVICE USING POLYIMIDE AND NITRIDE FILMS FOR THE PASSIVATION FILM

[75] Inventor: Kazuhiro Tsurumaru, Fuchu, Japan

[73] Assignee: Hitachi, Ltd., Tokyo, Japan

[21] Appl. No.: 837,757

[22] Filed: Mar. 10, 1986

Related U.S. Application Data

[63] Continuation of Ser. No. 670,812, Nov. 13, 1984, abandoned, which is a continuation of Ser. No. 256,110, Apr. 21, 1981, abandoned.

[30] Foreign Application Priority Data

Apr. 25, 1980 [JP] Japan .................................. 55-54137

[51] Int. Cl.[4] ..................... H01L 29/34; H01L 23/48; H01L 23/28
[52] U.S. Cl. ......................................... 357/54; 357/65; 357/68; 357/71; 357/72; 357/73
[58] Field of Search ..................... 357/54, 68, 71-73, 357/65

[56] References Cited

U.S. PATENT DOCUMENTS

| | | | |
|---|---|---|---|
| 3,911,475 | 10/1975 | Szedon et al. | 357/72 |
| 3,945,030 | 3/1976 | Seales | 357/54 |
| 4,001,870 | 1/1977 | Saiki et al. | 357/54 |
| 4,001,871 | 1/1977 | Tsunemitsu | 357/54 |
| 4,060,828 | 11/1977 | Satonaka | 357/72 |
| 4,091,406 | 5/1978 | Lewis | 357/54 |
| 4,248,920 | 2/1981 | Yoshizumi et al. | 357/72 |
| 4,365,264 | 12/1982 | Mukai et al. | 357/54 |
| 4,394,678 | 7/1983 | Winchell et al. | 357/71 |

FOREIGN PATENT DOCUMENTS

| | | | |
|---|---|---|---|
| 52-71068 | 6/1976 | Japan | 357/54 |
| 52-58491 | 5/1977 | Japan | 357/73 |
| 52-58469 | 5/1977 | Japan | 357/73 |
| 54-14672 | 2/1979 | Japan | 357/71 |
| 56-107570 | 1/1980 | Japan | 357/72 |

OTHER PUBLICATIONS

R. K. Agnihotri et al., "Multilayer Polyimide Insulator for Semiconductors", *IBM Technical Disclosure Bulletin*, vol. 22, (1988), pp. 4508-4509.

A. J. Belliveau et al., "Laminated Glass Coatings on Semiconductor Devices", IBM Technical Disclosure Bulletin; vol. 7, (1964), p. 404.

*Primary Examiner*—J. Carroll
*Attorney, Agent, or Firm*—Antonelli, Terry & Wands

[57] ABSTRACT

Herein disclosed is a semiconductor device having a semiconductor element, which is constructed to include a bonding pad for the semiconductor element formed selectively on one main side of a semiconductor layer, with a nitride film so formed on the main side of said semiconductor layer as to expose the surface of said bonding pad to the outside, and with a polyimide resin film formed on both said bonding pad and said nitride film. A sealing resin is formed to cover the surface portion of the bonding pad and the nitride film. This construction seals the semiconductor element from moisture, and prevents corrosion of the bonding pad due to said moisture.

16 Claims, 15 Drawing Figures

RESIN-MOLDED SEMICONDUCTOR DEVICE USING POLYIMIDE AND NITRIDE FILMS FOR THE PASSIVATION FILM

This is a continuation of application Ser. No. 670,812, filed Nov. 13, 1984, abandoned, which is a continuation of application Ser. No. 256,110, filed Apr. 21, 1981, abandoned.

BACKGROUND OF THE INVENTION

The present invention relates to a semiconductor device of resin-molded type having a high reliability (e.g., a high moisture resisting property).

A semiconductor device of resin-molded type, in which a dye- or wire-bonded semiconductor element is molded and sealed (or packaged) upon a lead frame by means of a resin such as epoxy resin, has the advantages that its sealing construction is simple and that it can be fabricated at a low cost. However, such resin-molded semiconductor device has the disadvantage that its moisture resistance is inferior to that of a ceramic type package. More specifically, since such a resin will allow moisture to pass therethrough, the moisture outside of the package passes through the resin into the package so that it wets and corrodes the bonding pad of aluminum, which is formed on the surface of a semiconductor element, until the electrical connection breaks or deteriorates, thereby to shorten the life of and degrade the reliability of the semiconductor device.

With this in mind, the inventors proposed forming the surface of the semiconductor element of a resin-molded type package with a nitride film as a passivation film so that the moisture having passed through the resin will not wet the surface of the semiconductor element. For instance, FIG. 1 shows an example of that proposal, wherein a silicon oxide ($SiO_2$) film 2 and an aluminum pad 3 are formed upon a semiconductor element 1 made primarily of silicon (Si), a phosphor glass (phospho-silicate glass) (PSG) film 4 is formed on the silicon oxide film 2 and the aluminum pad 3, a nitride $Si_3N_4$ film 5 is formed on the phosphor glass film 4, and the formed structure is molded with a resin 6. By the formation of such nitride film 5, the moisture having passed through the resin 6, if any, is blocked from passing into the nitride film 5 so that the moisture can be prevented from directly wetting the surface of the semiconductor element 1.

However, it has been found that a sufficiently satisfactory reliability (or moisture resisting property) cannot be obtained even if the semiconductor device is constructed in the manner thus far described. The reason therefor will be described in the following. Because of insufficient adherence between the resin 6 and the nitride film 5, there is established between the resin 6 and the nitride film 5 a clearance, in which the moisture which has passed through the resin 6 collects. Moreover, since; in case of removing a portion of the nitride film on the pad 3 to expose a bonding area of the pad 3 prior to the bonding step, the bonding area must be made larger than the contact area between the wire 7 and the pad 3 considering the error of the alignment between the pad and the wire in bonding the wire, a portion of the bonding area is exposed to the resin 6 after bonding the wire 7, and the nitride film 5 has its end face positioned in the vicinity of the pad 3. As a result, either the moisture stored in the clearance between the nitride film and the resin or the moisture passing through the clearance moves from the end face of the nitride film up to the surface of the pad until it corrodes the pad. Especially in the case where the phosphor glass film 4 is used, as shown in FIG. 1, the glass film 4 has its end face exposed to the pad 3. As a result, the moisture having passed through the resin and the aforementioned exposed phosphor glass film react to produce phosphoric acid, by which the aforementioned pad is corroded. In order to prevent this, it is sufficient to form the nitride film 5 on the wire and the pad, too. It is, however, almost impossible to form a nitride film under the condition in which the wire has been connected to the pad, because the nitride film is formed by the plasma method.

Incidentally, although the nitride film 5 is formed on the phosphor glass film 4 in the example shown in FIG. 1, a semiconductor device having the nitride film formed directly upon the silicon oxide film 2 likewise experiences corrosion of the bonding pad. In this instance, an impurity (in the form of ions) in the resin 6 and the moisture react to promote the aforementioned corrosion.

SUMMARY OF THE INVENTION

It is therefore an object of the present invention to provide a semiconductor device which can have a lengthened life and an improved reliability.

DESCRIPTION OF THE PREFERRED EMBODIMENTS

Figure 2:
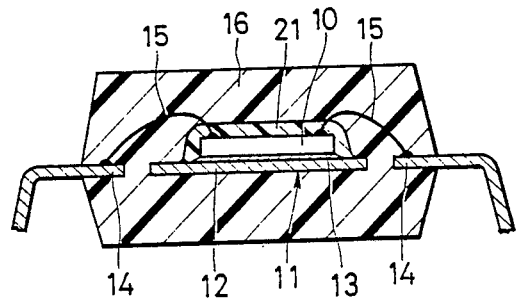
FIG. 2 is a sectional view showing the whole construction of a semiconductor device according to one embodiment of the present invention.

FIG. 2 is a sectional view showing one embodiment of a semiconductor device according to the present invention. A semiconductor element 10, in which an integrated circuit is constituted mainly of a silicon (Si) layer, is bonded by the use of an Au-Si eutectic crystal or Ag paste 13 to the tab 12 of a lead frame 11 made of metal such as "Kovar" (a trademark). A plurality of bonding pads formed on the surface of the semiconductor element 10 thus constructed are connected with the leads 14 of the aforementioned lead frame 11 through metal wires 15. On the other hand, the aforementioned semiconductor element 10 has its surface covered with a polyimide resin film 21. Moreover, the aforementioned semiconductor element 10 and the tab 12 and metal leads 14 are molded and sealed into an integral structure by means of a sealing resin 16.

Figure 3:
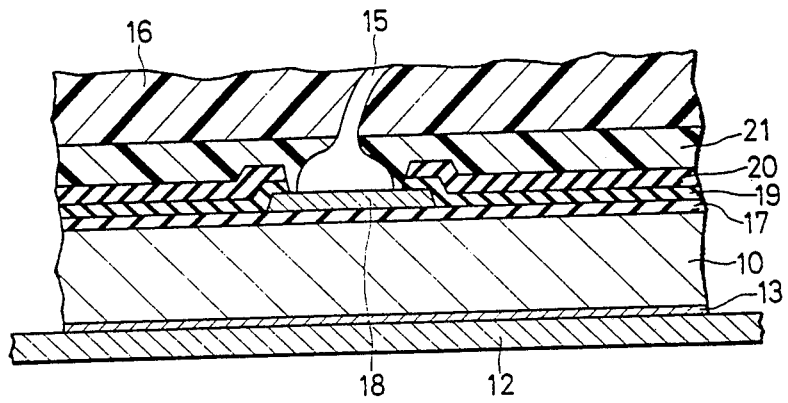
FIG. 3 is an enlarged sectional view showing a portion of the semiconductor device of FIG. 2.
Figure 4:
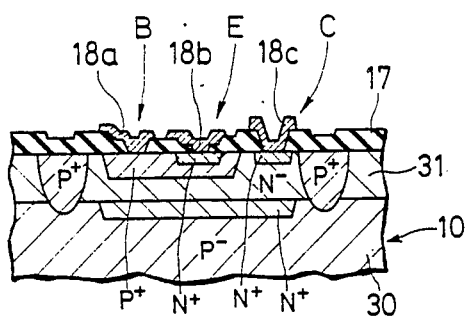
FIGS. 4 to 8 are a series of sectional views illustrating the method of fabricating the semiconductor device shown in FIG. 2.

The surface portion of the aforementioned semiconductor element 10 is shown in detail in FIG. 3. As shown, there is formed on the surface of the semiconductor element 10, as is well known in the art, a silicon oxide ($SiO_2$) film 17, by which the surface of the element is intended to be protected. Moreover, the aforementioned silicon oxide film 17 is formed thereon with an aluminum wiring, which is etched into a preset pattern, and a bonding pad 18 which exists at a portion thereof. The upper side of the element thus formed is further formed with a phosphor glass film 19 and a nitride film 20. The phosphor glass film 19 is used to restrain $Na^+$ ions or the like, which are contained in the silicon oxide film 17, thereby to prevent the characteristics of the semiconductor element from becoming unstable, due to movements of the $Na^+$ ions or the like within the silicon oxide film. On the other hand, the nitride film 20 acts to repel the moisture which could pass into the element from the outside, thereby to prevent the moisture from wetting the element and to protect the aforementioned phosphor glass film 19, which is relatively weak against the attack of the moisture. Moreover, although the aforementioned phosphor glass film 19 and nitride film 20 are formed all over the surface of the element 10, their portions corresponding to the aforementioned pad 18 are removed by etching or the like as to have at least a portion of the surface of pad 18 exposed to the outside, and the metal wire 15 is bonded to the exposed surface, as shown. Moreover, the polyimide resin film 21 (made of, e.g., polyimide-isoindoloquinazolinedione) is formed on the structure thus made such that it covers not only the upper surface of the aforementioned nitride film 20 occupying substantially the whole surface of the element but also the aforementioned pad 18 to which the wire is bonded. Indicated at reference numerals 12 and 16 in FIG. 3 are the tap of the lead frame and the sealing resin which is molded to the outer side of the aforementioned polyimide resin film 21, respectively, in a similar manner to those appearing in FIG. 2.

Since the semiconductor device according to the present embodiment has the construction thus far described, the resin 16 is molded on the nitride film 20 through the polyimide resin which has sufficient adherence to both the sealing resin and the nitride film. As a result, the adherence between the resin 16 and the polyimide resin film 21, and between the polyimide resin film and the nitride film, is so excellent that clearances are not formed between the resin 16 and the polyimide resin film 21, or between the polyimide resin film 21 and the nitride film 20. As a result, the moisture which has passed inwardly through the resin 16 neither strays between the resin 16 and the polyimide resin film 21 nor between the polyimide resin film 21 and the nitride film 20 until it takes a dispersed state at the outside of the nitride film 20 and the polyimide resin film 21. As a result, such moisture does not flow on the nitride film up to the surface of the pad 18 so that little water wets the surface of the pad 18. At the same time, since the pad 18 is covered with the polyimide resin film 21 so that it does not directly contact the resin 16, the moisture which has passed through the resin 16 does not penetrate directly to the surface of the pad 18 so that the water can be prevented from wetting the pad surface in that direction, too. Thus, the prevention of corrosion of the pad can be remarkably enhanced so that the semiconductor can have its life lengthened and its reliability improved.

Figure 5:
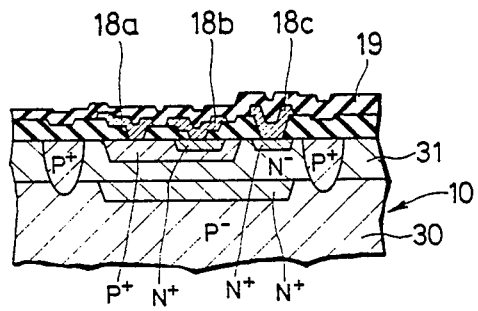
Figure 6:
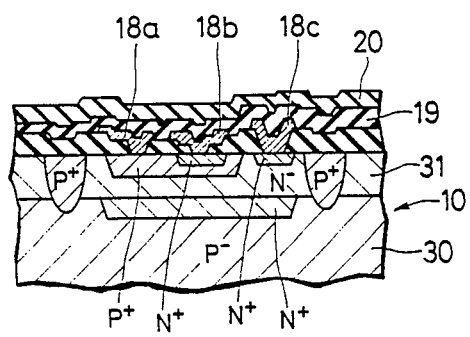
Figure 7:
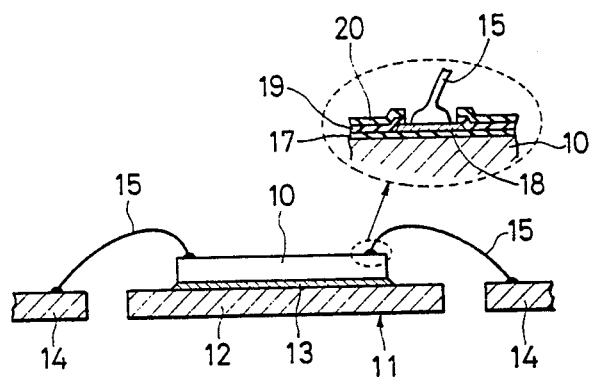
Figure 8:
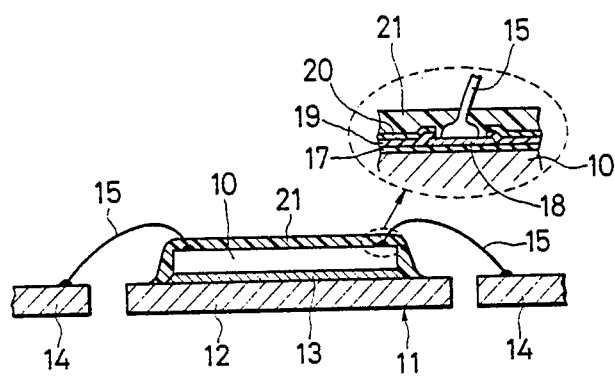

The method of fabricating the aforementioned semiconductor device shown in FIGS. 2 and 3 will now be described with reference to FIGS. 4 to 8 shows a semiconductor device which has an $N^-$-type epitaxial semiconductor layer 31 formed on a P-type semiconductor substrate 30 thereby to construct a bipolar type transistor in the embodiment to be described. The silicon oxide film 17 formed on the surface of the element 10 is formed by an etching treatment with holes at its portions corresponding to the respective regions of the phase B, emitter E and collector C of the element 10 and with wirings 18a, 18b and 18c, which are connected with the respective regions of the base B, emitter E and collector C, respectively, by the vacuum-evaporating and etching treatments. Moreover, there is deposited upon those wirings 18a, 18b and 18c all over the surface of the element a phosphor glass film 19 (as shown in FIG. 5), on which a nitride film 20 is deposited by the plasma process (as shown in FIG. 6). After that, the portions of phosphor glass film 19 and nitride film 20 corresponding to the bonding pads 18 formed on the ends of the aforementioned respective wirings 18a, 18b and 18c at one side thereof are etched off by photolithography so that holes are formed to expose the surface of the pads 18 to the outside. The element 10 thus formed is pellet-bonded to the tab 12 to the lead frame 11, as shown in FIG. 7, by means of the Au-Si eutectic crystal or Ag paste 13 while connecting the leads 14 of the lead frame 11 and the aforementioned pads 18 by means of wires 15. After these connections are carried out, the aforementioned element 10 is coated by potting treatment with the polyimide resin 21 in a manner to cover the upper surface of the element 10, as shown in FIG. 8, thereby to form the polyimide resin film 21 on the nitride film 20 and the pads 18, as shown in an enlarged scale in FIG. 8 and in FIG. 3. After that, the structure thus constructed is molded and sealed by means of the resin 16 by the use of the well-known transfer molding process so that the semiconductor shown in FIG. 2 can be fabricated.

Other embodiments of the present invention will be described in the following.

Figure 1:
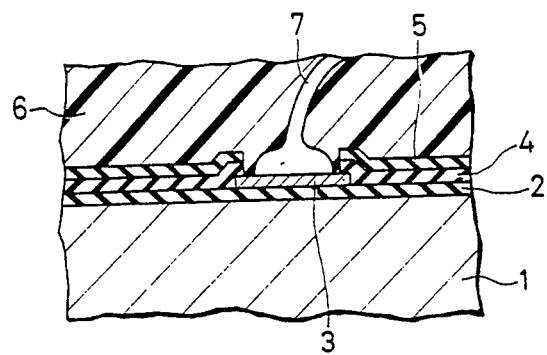
FIG. 1 is a sectional view showing a portion of a semiconductor device proposed by the present inventors.
Figure 9:
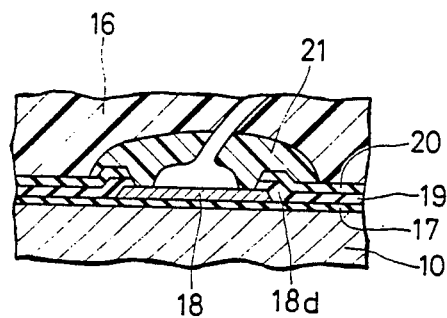
FIG. 9 is an enlarged sectional view showing a portion of a semiconductor device according to another embodiment of the present invention.

FIG. 9 shows another embodiment, in which the polyimide resin film 21 is formed only at the pad portion, i.e., the pad 18 and its peripheral portion 18d, including adjacent portions of the nitride film. Only the pad portion of the semiconductor device formed in a similar manner to the embodiment of FIG. 7, for example, is potted with a small quantity of a polyimide resin thereby to form the polyimide resin film 21 at the pad portion. According to the construction thus far described, such a portion other than the pad portion as is not formed with the polyimide resin film 21 has such a deteriorated adherence between the resin 16 and the nitride film 20, similar to that shown in FIG. 1, that it is formed with a clearance to store moisture. However, since there is not formed any clearance by the polyimide resin film 21 at the pad portion, the aforementioned water which collects between the resin 16 and nitride film 20, if any, can be blocked from flowing toward the pad 18 at the periphery thereof. As a result, the water can be prevented from wetting the surface of the pad 18 whereby to improve the life and moisture resisting reliability of the device. Incidentally, the present embodiment thus far described is effective to reduce the cost because only a small quantity of the polyimide resin is used.

Figure 10:
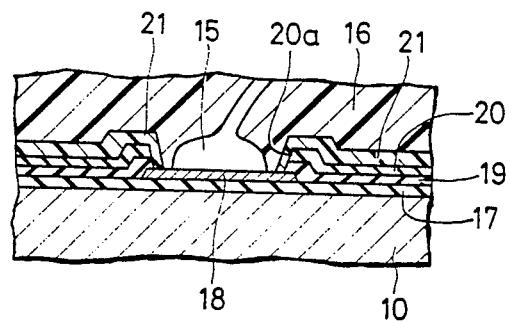
FIG. 10 is an enlarged sectional view showing a portion of a semiconductor device according to a further embodiment of the present invention.
Figure 11:
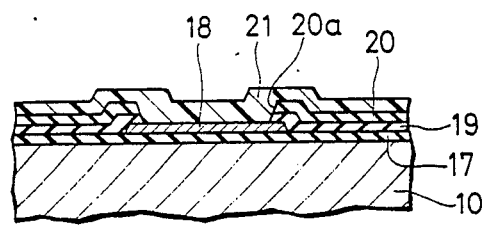
FIGS. 11 and 12 are a series of sectional views illustrating the method of fabricating the semiconductor device shown in FIG. 10.
Figure 12:
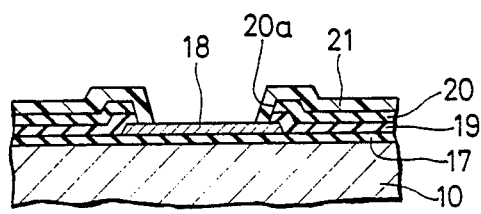

FIG. 10 shows a further embodiment, in which the portion other than the pad surface is formed with the polyimide resin film 21. As the fabricating method is illustrated in FIGS. 11 and 12, more specifically, the element 10 first has its surface formed with the phosphor glass film 19 and the nitride film 20 and at the portion corresponding to the pad 18 with a hole thereby to partially expose the pad surface to the outside. After that, the element has a polyimide resin film 21 formed over its entire surface. After that, the portion of the polyimide resin film 21 which corresponds to the pad 18 is etched off by photolithography in a manner to have a slightly smaller size than the hole of the aforementioned phosphor glass film 19 and nitride film 20 so that the pad surface may be partially exposed again to the outside. It is then sufficient to package the element 10 and to bond the wires 15 to the pad 18.

As a result, as shown in FIGS. 10 and 12, not only the upper surface of the nitride film 20 but also the etching end face 20a arranged to surround the pad 18 are covered with the polyimide resin film 21. Thus, the present embodiment is so constructed that the surface of the wire-bonded pad 18 is directly connected with the resin 16. However, since the polyimide resin film 21 is formed around the pad, the exposed area (excepting that of the wire) of the aforementioned pad is so restricted that remarkably little water directly wets the pad surface through the resin. Similar to the foregoing embodiment, moreover, little water wets the pad surface through the clearances between the nitride film 20 and the resin 16 and between the film 20 and the polyimide resin 21, whereby the pad can be effectively prevented from being corroded. The present embodiment is more advantageous in its fabricating steps because the polyimide resin film 21 is formed integrally with the element prior to the packaging step (including the pellet-bonding and wire-bonding treatments).

Figure 13:
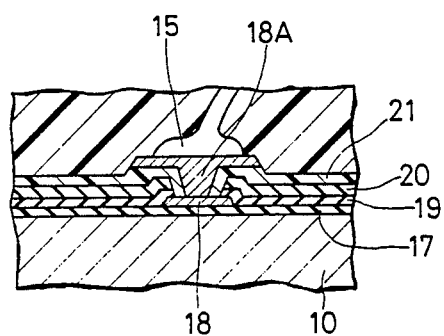
FIG. 13 is an enlarged sectional view showing a portion of a semiconductor device according to a further embodiment of the present invention.

In the case of the present embodiment the construction of the pad may be so made as is shown in FIG. 13. More specifically, after the polyimide resin film 21 has been formed in the aforementioned manner, the metal film 18A of aluminum or the like is vacuum-evaporated upon the film 21 and is then subjected to etching treatment so that the combination of pad 18 and metal film 18A is made so thick as to have its surface protruding upwardly of the polyimide resin film 21. Thus, the life against corrosion is further lengthened by the increase in the thickness of the combination of pad 18 and metal film 18A, in comparison with the thickness of pad 18, so that the reliability can be accordingly improved.

Figure 14:
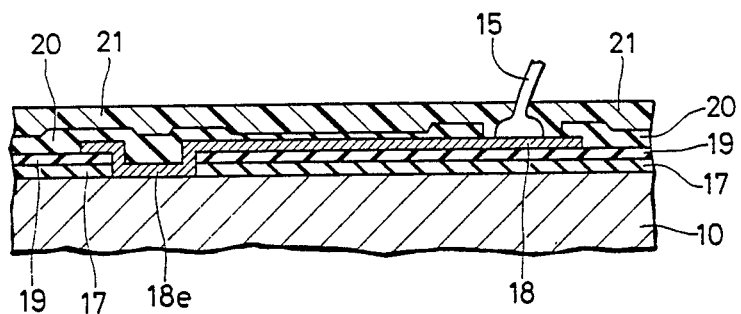
FIGS. 14 and 15 are enlarged sectional views showing portions of semiconductor devices according to further embodiments of the present invention.

As shown in FIG. 14, the present invention can also be applied to the element in which an aluminum wiring 18e and the pad 18 forming a part thereof are formed on the surface of the element 10 and on the phosphor glass film 19. In this application, only the nitride film 20 is overlaid on the periphery of the pad 18, but the formation of the polyimide resin film 21 can be performed in a similar manner to that of the cases of the aforementioned respective embodiments with the similar resultant effects being obtainable.

Figure 15:
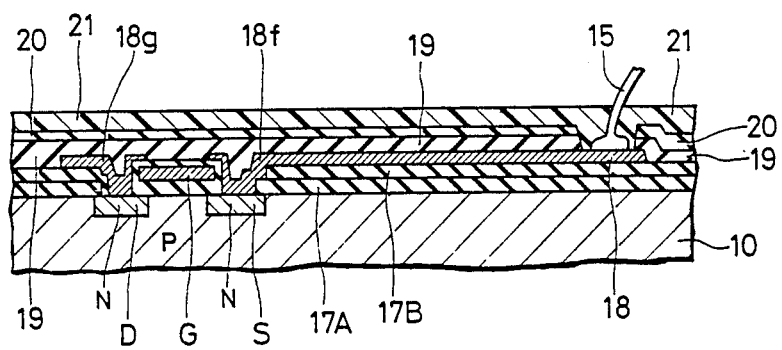

FIG. 15 shows a further embodiment of the present invention. This embodiment corresponds to the case in which the present invention is applied to the device which has its element 10 formed to have the MOS construction. Aluminum wirings 18f and 18g, which are connected, respectively, with the source and drain regions S and D formed in the element 10, are formed on two-layered silicon oxide films 17A and 17B while partially extending to form the pad 18. Indicated at reference letter G is a gate electrode which is made of silicon. Moreover, the aforementioned aluminum wirings 18f and 18g have formed thereon the phosphor glass film 19 and the nitride film 20, and the portion of the phosphor glass film 19 and nitride film 20 correspondingly to the pad it etched off so that the wires 15 can be bonded to the pad. After bonding of the wires 15 to the pad, the element is covered all over its surface with the polyimide resin film 21. In this embodiment, therefore, the construction of the pad portion which might otherwise be troubled by corrosion is made similar to that of the aforementioned respective embodiments so that the excellent effects can be attained.

Incidentally, although all the aforementioned embodiments exemplify the element which has its surface formed with the phosphor glass film, the present invention can be likewise practised as an element which requires no film of that kind but which has the nitride film formed directly upon the silicon oxide film and the pad, as can be naturally understood from the foregoing description.

As has been described hereinbefore, according to the present invention, the nitride film formed on the element surface cooperates with the polyimide resin film, to prevent sufficient moisture to cover the pad from reaching the pad, whereby resin-molding and sealing can be accomplished. As a result, the moisture having passed through the sealing resin, if any, can be prevented from corroding the pad, so that the moisture resisting property of the semiconductor element can be enhanced to lengthen its life and improve its reliability. Moreover, the formation of the polyimide resin film is effective as a countermeasure to possible damage by alpha rays.

What is claimed is:
1. A semiconductor device comprising:
a wiring layer having wiring and having a bonding pad on which a metal wire is to be bonded, the wiring of the wiring layer being directly connected to the bonding pad, the wiring layer being formed selectively on an insulating film overlying a main surface of a semiconductor substrate in which a desired circuit element is formed;
a nitride film formed over said insulating film and said wiring layer and having a hole for exposing the surface of said bonding pad, said nitride film being formed on the peripheral portion of the bonding pad;
a metal wire bonded to the surface of said bonding pad; and
a sealing resin formed to cover said metal wire and said nitride film, said sealing resin forming a seal for the circuit element, to thereby provide a resin-sealed semiconductor device;
further including a polyimide resin film sandwiched between said sealing resin and said nitride film, said polyimide resin film being formed on the peripheral portion of the bonding pad, the nitride film cooperating with the polyimide resin film to sufficiently prevent moisture from passing to the bonding pad so as to substantially prevent corrosion of the bonding pad due to the moisture, the nitride film and the polyimide resin film thereby protecting the peripheral portion of the bonding pad whereby a resin-sealed semiconductor device can be provided.

2. A semiconductor device according to claim 1, wherein said polyimide resin film is formed on both the surface portion of said bonding pad which is exposed within the hole in said nitride film, and said nitride film, so that said sealing resin does not contact with the surface portion of said bonding pad which is exposed within the hole in said nitride film.

3. A semiconductor device according to claim 1, further comprising a phosphosilicate glass film formed between said nitride film and said insulating film so as to expose at least a portion of the surface of said bonding pad through the phosphosilicate glass film and nitride film.

4. A semiconductor device according to claim 1, wherein said desired circuit element is formed to have MOS construction.

5. A semiconductor device according to claim 1, wherein said polyimide resin film is made of polyimideisoindoloquinazolinedione.

6. A semiconductor device according to claim 1, wherein the bonding pad is made of a material corrodible by moisture.

7. A semiconductor device according to claim 6, wherein the bonding pad is made of an aluminum material.

8. A semiconductor device according to claim 1, wherein said metal wire is directly connected to the surface of said bonding pad, and is also directly connected to a lead frame for said semiconductor device.

9. A semiconductor device according to claim 8, wherein the wiring is also directly connected to said main surface of the semiconductor substrate in which a desired circuit element is formed.

10. A semiconductor device according to claim 1, wherein the polyimide resin film sandwiched between the sealing resin and nitride film is positioned to prevent moisture from passing underneath the sealing resin to the bonding pad, whereby corrosion of the bonding pad due to said moisture is substantially prevented.

11. A semiconductor device according to claim 1, wherein the polyimide resin film is in direct contact with said sealing resin.

12. A semiconductor device according to claim 11, wherein the polyimide resin film, in direct contact with said sealing resin, is also in direct contact with the bonding pad.

13. A semiconductor device according to claim 1, wherein the wiring is also directly connected to said main surface of the semiconductor substrate in which a desired circuit element is formed.

14. A semiconductor device according to claim 1, wherein the polyimide resin film is formed to cover the surface of the bonding pad exposed after bonding the metal wire to the surface of the bonding pad, and to cover adjacent portions of the nitride film.

15. A semiconductor device comprising:
a wiring layer having a bonding pad on which a metal wire is to be bonded, formed selectively on an insulating film overlying a main surface of a semiconductor substrate in which a desired circuit element is formed;
a nitride film formed over said insulating film and said wiring layer and having a hole for exposing the surface of said bonding pad;
a metal wire bonded to the surface of said bonding pad; and
a sealing resin formed to cover said metal wire and said nitride film, said sealing resin forming a seal for the circuit element, to thereby provide a resin-sealed semiconductor device;
further including a polyimide resin film sandwiched between said sealing resin and said nitride film, the polyimide resin film being formed on both the surface portion of said bonding pad which is exposed within the hole in said nitride film, and said nitride film, so that said sealing resin does not contact with the surface portion of said bonding pad which is exposed within the hole in said nitride film, the nitride film cooperating with the polyimide resin film to sufficiently prevent moisture from passing to the bonding pad so as to substantially prevent corrosion of the bonding pad due to the moisture, whereby a resin-sealed semiconductor device can be provided.

16. A semiconductor device comprising:
a wiring layer having a bonding pad on which a metal wire is to be bonded, formed selectively on an insulating film overlying a main surface of a semiconductor substrate in which a desired circuit element is formed;
a nitride film formed over said insulating film and said wiring layer and having a hole for exposing the surface of said bonding pad;
a metal wire bonded to the surface of said bonding pad;
a polyimide resin formed to cover said bonding pad and said nitride film; and
a sealing resin formed to cover said polyimide resin and said metal wire, said sealing resin forming a seal for the circuit element, to thereby provide a resin-sealed semiconductor device, the polyimide resin being formed on both the surface portion of said bonding pad which is exposed within the hole in said nitride film, and said nitride film, so that said sealing resin does not contact with the surface portion of said bonding pad which is exposed within the hole in said nitride film, the nitride film cooperating with the polyimide resin to sufficiently prevent moisture from passing to the bonding pad so as to substantially prevent corrosion of the bonding pad due to the moisture, whereby a resin-sealed semiconductor device can be provided.

* * * * *